United States Patent
Yu et al.

(10) Patent No.: US 9,837,595 B2
(45) Date of Patent: Dec. 5, 2017

(54) SEMICONDUCTOR PACKAGE ASSEMBLY WITH THERMAL RECYCLING FUNCTION

(71) Applicant: MediaTek Inc., Hsin-Chu (TW)

(72) Inventors: Long-Kun Yu, New Taipei (TW); Chin-Chiang Chang, Kaohsiung (TW); Chia-Wei Chi, Taipei (TW); Chia-Feng Yeh, New Taipei (TW); Tai-Yu Chen, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 125 days.

(21) Appl. No.: 14/717,159

(22) Filed: May 20, 2015

(65) Prior Publication Data

US 2016/0343929 A1 Nov. 24, 2016

(51) Int. Cl.
| | |
|---|---|
| H02J 7/04 | (2006.01) |
| H02J 7/16 | (2006.01) |
| H01L 35/32 | (2006.01) |
| H01L 23/498 | (2006.01) |
| H01L 35/28 | (2006.01) |

(Continued)

(52) U.S. Cl.
CPC ............ *H01L 35/32* (2013.01); *H01L 22/34* (2013.01); *H01L 23/04* (2013.01); *H01L 23/12* (2013.01); *H01L 23/20* (2013.01); *H01L 23/49811* (2013.01); *H01L 24/17* (2013.01); *H01L 25/04* (2013.01); *H01L 35/28* (2013.01); *H02J 7/0052* (2013.01); *H01L 23/38* (2013.01); *H01L 23/49827* (2013.01); *H01L 2224/08145* (2013.01); *H01L 2224/16145* (2013.01); *H01L 2224/16227* (2013.01); *H01L 2224/1703* (2013.01); *H01L 2224/17051* (2013.01); *H01L 2224/17107* (2013.01); *H01L 2224/17181* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/18161* (2013.01)

(58) Field of Classification Search
CPC .................................. H02J 3/387; H02J 3/382
USPC .................................................. 320/166–167
See application file for complete search history.

(56) References Cited

U.S. PATENT DOCUMENTS 9,214,619 B2 * 12/2015 Bai .................. H01L 35/325
9,491,865 B1 * 11/2016 Chen .................. H05K 1/185
(Continued)

FOREIGN PATENT DOCUMENTS

| EP | 2688193 A1 | 1/2014 |
|---|---|---|
| JP | 200014026 A | 1/2000 |

(Continued)

*Primary Examiner* — Nghia Doan
(74) *Attorney, Agent, or Firm* — McClure, Qualey & Rodack, LLP

(57) ABSTRACT

The invention provides a portable electronic system. The portable electronic system includes a semiconductor package. The semiconductor package includes a substrate. A semiconductor die is coupled to the substrate. A thermoelectric device chip is disposed close to the semiconductor die, coupled to the substrate. The thermoelectric device chip is configured to detect a heat energy generated from the semiconductor die and to convert the heat energy into a recycled electrical energy. A power system is coupled to the semiconductor package, configured to store the recycled electrical energy.

18 Claims, 5 Drawing Sheets

(51) Int. Cl.
*H01L 21/66* (2006.01)
*H01L 23/04* (2006.01)
*H01L 23/12* (2006.01)
*H01L 23/20* (2006.01)
*H01L 23/00* (2006.01)
*H01L 25/04* (2014.01)
*H02J 7/00* (2006.01)
*H01L 23/38* (2006.01)

(56) References Cited

U.S. PATENT DOCUMENTS

| | | | |
|---|---|---|---|
| 2014/0176041 A1* | 6/2014 | Sun | H01L 35/30 320/101 |
| 2014/0252531 A1* | 9/2014 | Aryan | H01L 35/32 257/467 |
| 2016/0276566 A1 | 9/2016 | Pirk et al. | |

FOREIGN PATENT DOCUMENTS

| WO | 2010120287 A1 | 10/2010 |
|---|---|---|
| WO | 2015062818 A1 | 5/2015 |

* cited by examiner

SEMICONDUCTOR PACKAGE ASSEMBLY WITH THERMAL RECYCLING FUNCTION

BACKGROUND OF THE INVENTION

Field of the Invention

The present invention relates to a semiconductor package assembly, and in particular to a portable electronic system with a thermal recycling function.

Description of the Related Art

Portable devices have been developed to satisfy the requirements of low power consumption, high density, and high power efficiency. However, the heat dissipation problem limits the development of portable devices. For example, long-term-evolution (LTE) chips and other mobile chips require more power for high bandwidth transmission. The higher power consumption produces a higher rising temperature of the chips. The rising temperature of the chips results in heat dissipation problems, a reduced lifetime, and the slower transmission speeds.

Thus, a novel semiconductor package assembly is desirable.

BRIEF SUMMARY OF THE INVENTION

An exemplary embodiment of a portable electronic system includes a semiconductor package. The semiconductor package includes a substrate. A semiconductor die is coupled to the substrate. A thermoelectric device chip is disposed close to the semiconductor die, coupled to the substrate. The thermoelectric device chip is configured to detect a heat energy generated from the semiconductor die and to convert the heat energy into a recycled electrical energy. A power system is coupled to the semiconductor package, configured to store the recycled electrical energy.

Another exemplary embodiment of a semiconductor package assembly includes a base. A substrate is mounted on the base. A semiconductor die is coupled to the substrate. A thermoelectric device chip laminates on the semiconductor die. The thermoelectric device chip is configured to detect a heat energy generated from the semiconductor die and to convert the heat energy into a recycled electrical energy. A shielding case is disposed on the base. The shielding case surrounds the semiconductor package without covering a top surface of the thermoelectric device chip. A power system is mounted on the base and coupled to the thermoelectric device chip, configured to store the recycled electrical energy.

An exemplary embodiment of a method for converting a thermal energy into an electrical energy in a portable electronic system includes detecting a heat energy generated by operating a semiconductor die using a thermoelectric device chip. The semiconductor die and the thermoelectric device chip are packaged within a semiconductor package. The heat energy is converted into a recycled electrical energy using the thermoelectric device chip. The recycled electrical energy is charged to a power system configured to distribute an electrical power to the semiconductor die.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
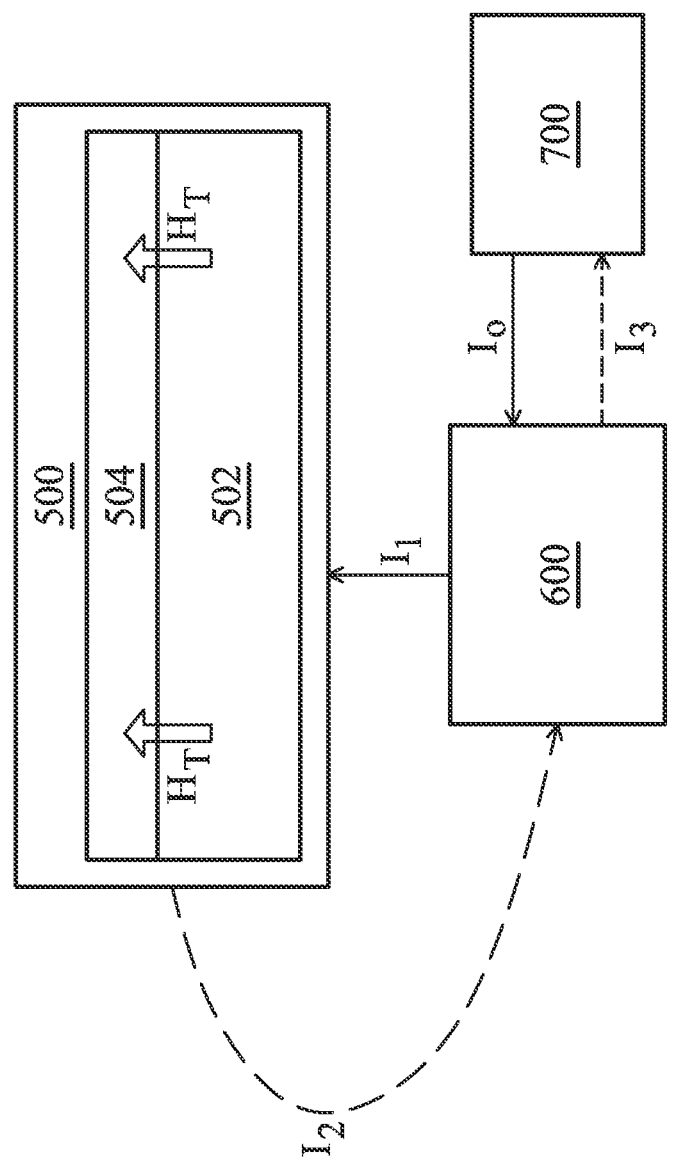
FIG. 1 is a functional diagram of a portable electronic system showing the electrical energy transmission in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a functional diagram of a portable electronic system showing the electrical and thermal energies transmission in accordance with some embodiments of the disclosure. As shown in FIG. 1, the portable electronic system comprises a semiconductor package assembly 500, a power system 600 and a battery 700. In some embodiments, the semiconductor package assembly 500 comprises a semiconductor die 502 and a thermoelectric device chip 504 both packaged as a thermal energy recycling semiconductor package. The power system 600 is coupled to the semiconductor package assembly 500 and the battery 700. The battery 700 serves as a power source to output an electrical energy as a current $I_0$ and supply to the power system 600. The power system 600 is configured to distribute an electrical power as a current $I_1$ from the current $I_0$ to the semiconductor package assembly 500 for the operation of semiconductor die 502. In some embodiments, the semiconductor die 502 generates a heat energy $H_T$ by the operation of the semiconductor die 502. The thermoelectric device chip 504 is configured to detect the heat energy $H_T$ generated from the semiconductor die 502 and to convert the heat energy $H_T$ into a recycled electrical energy and then output as a current $I_2$ to the power system 600. The power system 600 is also configured to store the recycled electrical energy as a stored recycled electrical energy and output as a current $I_3$ to charge the battery 700. Accordingly, the portable electronic system allows the heat energy generated from the semiconductor die 502 of the thermal energy recycling semiconductor package to be converted into a recycled electrical energy to be stored in the power system 600 and charge the battery 700.

Figure 2:
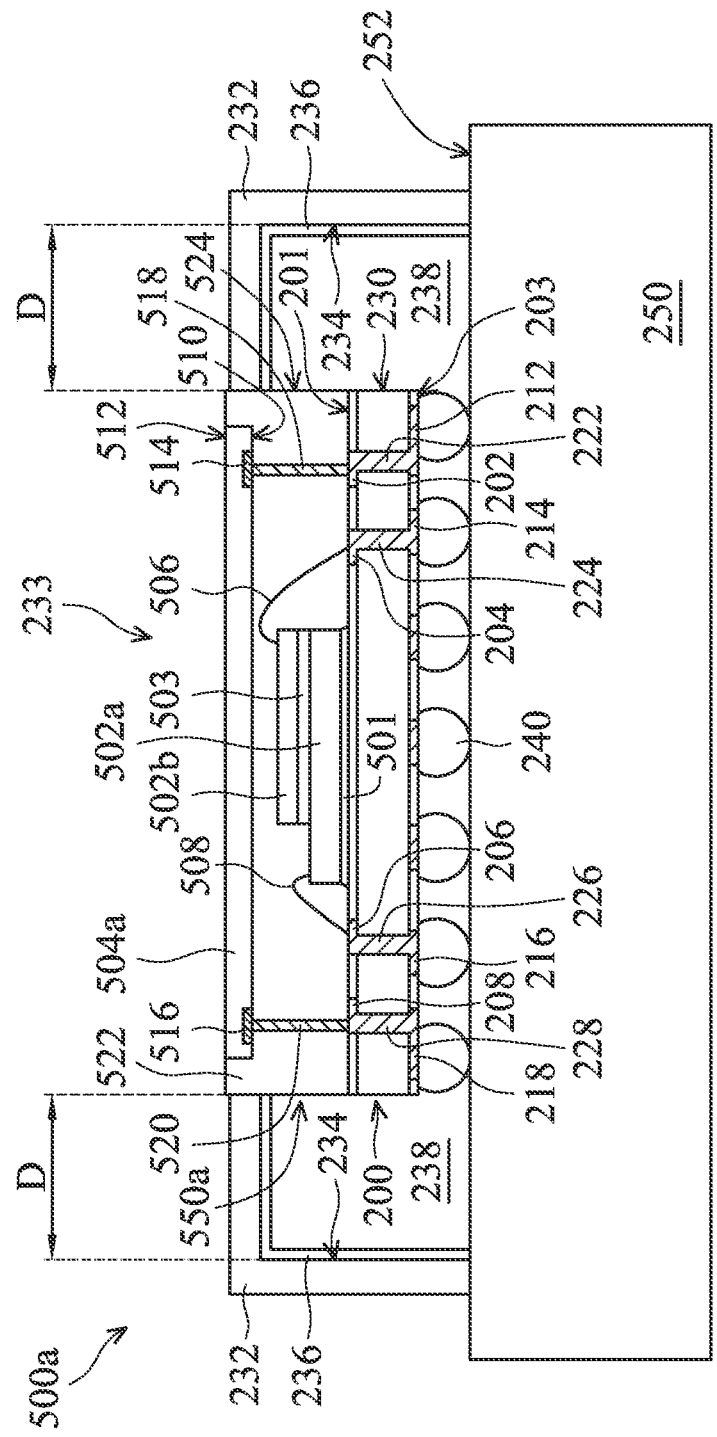
FIG. 2 is a cross-sectional view of a semiconductor package assembly including a wire bond ball-grid-array (BGA) semiconductor package and a thermoelectric device chip integrated within in accordance with some embodiments of the disclosure.

FIG. 2 is a cross-sectional view of a semiconductor package assembly 500a. The semiconductor package assembly 500a includes a wire-bond ball-grid-array (BGA) semiconductor package 550a and a thermoelectric device chip 504 integrated within in accordance with some embodiments of the disclosure. As shown in FIG. 2, the semiconductor package assembly 500a comprises a base 250, the wire-bond BGA semiconductor package 550a and a shielding case 232. To simplify the illustration, the power system and the battery shown in FIG. 1 are not repeated for brevity.

In some embodiments as shown in FIG. 2, the base 250, for example a printed circuit board (PCB), may be formed of polypropylene (PP). It should also be noted that the base 250 can be a single layer or a multilayer structure. A plurality of conductive traces (not shown) and pads (not shown) is disposed on a device-attach surface 252 of the base 250. In one embodiment, the conductive traces may comprise signal trace segments or ground trace segments, which are used for the input/output (I/O) connections of the BGA semiconductor package 550a. Also, the pads are disposed on the device-attach surface 252, connecting to different terminals of the conductive traces. The pads are used for the wire-bond BGA semiconductor package 550a and the power system 600 as shown in FIG. 1 mounted directly thereon.

As shown in FIG. 2, the wire-bond BGA semiconductor package 550a is mounted on the device-attach surface 252 of the base 250 by a bonding process. In this embodiment, the wire-bond BGA semiconductor package 550a is a package of large power consumption. The wire-bond BGA semiconductor package 550a may comprise a system-on-chip (SOC) package, a modem package, a radio-frequency (RF) module package including a power amplifier or a power management integrated circuit package. For example, the SOC package may comprise a logic package. In some embodiments as shown in FIG. 2, the wire-bond BGA semiconductor package 550a comprises a substrate 200, semiconductor dies 502a and 502b and a thermoelectric device chip 504a. In some embodiments, the substrate 200 has a device-attach surface 201 and a bump-attach surface 203 opposite to the device-attach surface. The substrate 200 may comprise circuits 222, 224, 226, 228 and pads 202, 204, 206, 208, 222, 224, 226 and 228. The pads 202, 204, 206 and 208 are respectively disposed on the top of circuitries 222, 224, 226 and 228 close to the device-attach surface 201. The pads 222, 224, 226 and 228 are respectively disposed on the bottom of the circuitries 222, 224, 226 and 228 close to the bump-attach surface 203. The circuitries 222, 224, 226 and 228 of the wire-bond BGA semiconductor package 550a are interconnected with the circuitry of the base 250 via a plurality of conductive structures 240 disposed on the bump-attach surface 203 of the substrate 200. Also, the conductive structures 240 are in contact with the base 250. In one embodiment, the conductive structures 240 may comprise a conductive bump structure such as a copper bump or a solder bump structure, a conductive pillar structure, a conductive wire structure, or a conductive paste structure.

As shown in FIG. 2, there are two semiconductor dies 502a and 502b attached to the substrate 200. The semiconductor die 502a is disposed on the device-attach surface 201 through an adhesion 501. Also, the semiconductor die 502b is disposed on the semiconductor die 502a through an adhesion 503. However, the number of semiconductor dies is not limited to the disclosed embodiment. In one embodiment, the semiconductor dies 502a and 502b may comprise a central processing unit (CPU), a graphics processing unit (GPU), a modem package, a power amplifier or a power management integrated circuit (PMIC) or any combination thereof. The semiconductor dies 502a and 502b are coupled to the pads 226 and 224 of the substrate 200 through bonding wires 508 and 506, respectively.

As shown in FIG. 2, a thermoelectric device chip 504a is disposed over the semiconductor dies 502a and 502b, but separated from the semiconductor dies 502a and 502b through the molding compound 522. That is to say, the substrate 200 and the thermoelectric device chip 504a are disposed on opposite sides of the semiconductor dies 502a and 502b. The molding compound 522 covers the substrate 200 and surrounds the semiconductor dies 502a and 502b and thermoelectric device chip 504a, leaving a top surface 512 of the thermoelectric device chip 504a, a sidewall 230 and the bump-attach surface 203 of the substrate 200 exposed. The thermoelectric device chip 504a is arranged in a way that the top surface 512 is exposed to air, and the bottom surface 510 covered by the molding compound 522 is close to the semiconductor die 502b. The thermoelectric device chip 504a is configured to detect a heat energy ($H_T$ shown in FIG. 1) generated from the semiconductor dies 502a and 502b during operation. The heat energy results in a significant temperature difference between the top surface 512 and the bottom surface 510 of the thermoelectric device chip 504a. More specifically, the temperature of the bottom surface 510 is higher than that of the top surface 512 during operation of the semiconductor dies 502a and 502b. If the detected temperature difference is larger a specific value (for example, 50° C.), the thermoelectric device chip 504a can convert the detected temperature difference into an voltage difference between the top surface 512 and the bottom surface 510 of the thermoelectric device chip 504a. As shown in FIG. 2, the thermoelectric device chip 504a comprises pads 514 and 516 coupled to the pads 222 and 228 of the substrate 200 by through mold vias (TMVs) 518 and 520 formed through the molding compound 522, respectively. The pads 514 and 516 are used to transmit an output current ($I_2$ shown in FIG. 1) translated from the voltage difference to the power system 600 as shown in FIG. 1 by the TMVs 518 and 520, the pads 222 and 228, the circuits 222 and 228 and the corresponding conductive structures 240. The pads 222 and 228 may serve as power pads, and circuits 222 and 228 may serve as power circuits of the substrate 200. Although the thermoelectric device chip 504a senses the heat energy and converts into the current, the heat energy generated from the semiconductor dies 502a and 502b mainly dissipates through a path comprising the pads 204 and 206, the circuits 224 and 226 and the corresponding conductive structures 240.

As shown in FIG. 2, the shielding case 232 is disposed on the base 250. The shielding case 232 surrounds the wire-bond BGA semiconductor package 550a. The shielding case 232 has an opening 233 on the wire-bond BGA semiconductor package 550a, leaving the thermoelectric device chip 504a exposed by of the shielding case 232. An inner sidewall 234 of the shielding case 232 is spaced apart from a sidewall 524 of the wire-bond BGA semiconductor package 550a by a distance D. A space 238 surrounded by a sidewall 524 of the molding compound, the sidewall 230 of the substrate 200, the shielding case 232 and the base 250 is filled with air for the heat isolation function. In some embodiments, the shielding case 232 may be formed by metal materials. In some other embodiments, an insulation film 236 may be conformably disposed on the inner sidewall 234 of the shielding case 232 for the improvement of the heat isolation function.

Figure 3:
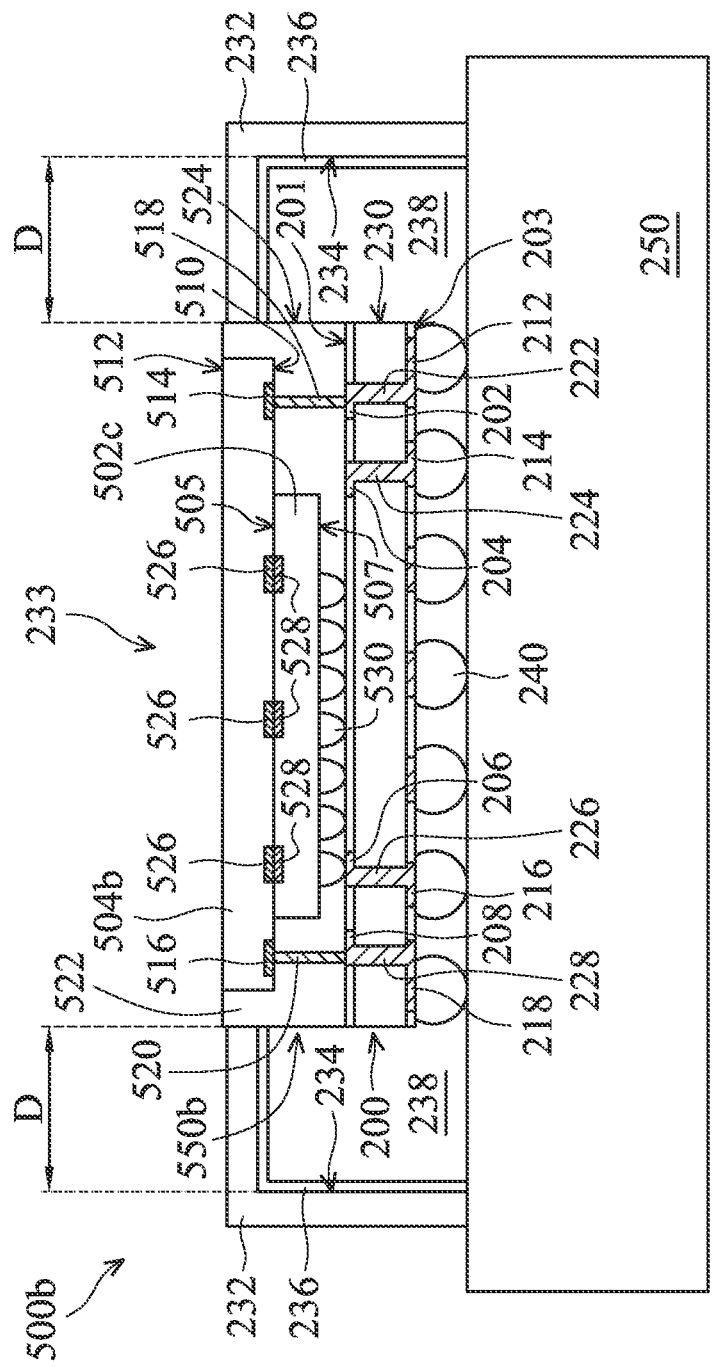
FIG. 3 is a cross-sectional view of a semiconductor package assembly including a flip-chip ball-grid-array (BGA) semiconductor package and a thermoelectric device chip integrated within in accordance with some embodiments of the disclosure.

FIG. 3 is a cross-sectional view of a semiconductor package assembly 500b including a flip-chip ball-grid-array (BGA) semiconductor package 550b and a thermoelectric device chip 504b integrated within in accordance with some embodiments of the disclosure. Elements of the embodiments hereinafter that are the same or similar as those previously described with reference to FIGS. 1 and 2, are not repeated for brevity. The differences between the semiconductor package assembly 500a and semiconductor package assembly 500b comprise the flip-chip BGA semiconductor package 550b is fabricated using the flip-chip technology. Accordingly, a semiconductor die 502c of the flip-chip BGA semiconductor package 550b may be designed to be in contact with a thermoelectric device chip 504b packaged within.

In this embodiment as shown in FIG. 3, the flip-chip BGA semiconductor package 550b is a package of large power consumption with a function similar to the wire-bond BGA semiconductor package 550a. The flip-chip BGA semiconductor package 550b comprises at least one semiconductor die 502c turned upside down and mounted on the substrate 200 using the flip-chip technology. More specifically, the semiconductor die 502c has a top surface 507 and a bottom surface 505. The top surface 507 of the semiconductor die 502c is coupled to the pad 226 of the substrate 200 using solder balls 530 disposed thereon. The bottom surface 505 of the semiconductor die 502c is coupled to the thermoelectric device chip 504b using pads 528 disposed on. In this embodiment, the pads 528 of the semiconductor die 502c is in contact with corresponding pads 526 of the thermoelectric device chip 504b.

Figure 4:
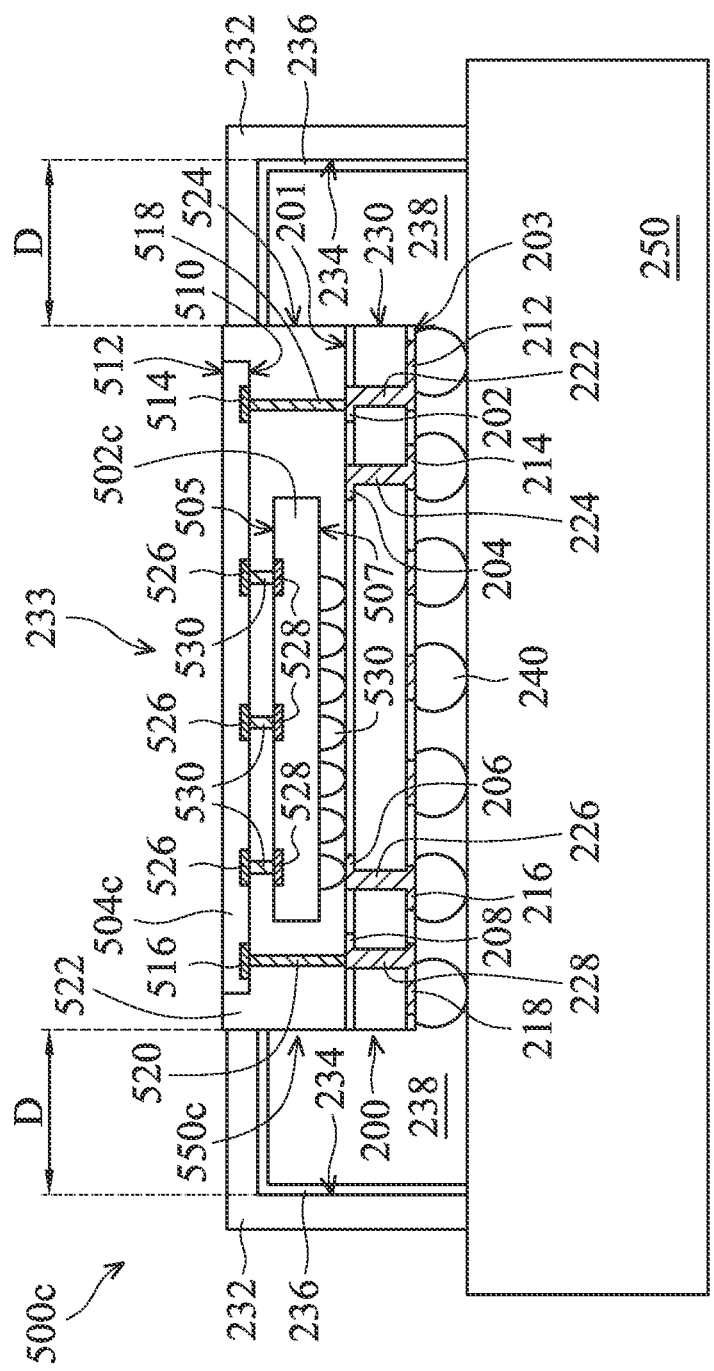
FIG. 4 is a cross-sectional view of a semiconductor package assembly including a flip-chip ball-grid-array (BGA) semiconductor package and a thermoelectric device chip integrated within in accordance with some embodiments of the disclosure.

FIG. 4 is a cross-sectional view of a semiconductor package assembly including a flip-chip ball-grid-array (BGA) semiconductor package 550c and a thermoelectric device chip 504c integrated within in accordance with some embodiments of the disclosure. Elements of the embodiments hereinafter that are the same or similar as those previously described with reference to FIGS. 1-3, are not repeated for brevity. One of the differences between the semiconductor package assembly 500c and semiconductor package assembly 500b is that the semiconductor package assembly 500c comprises a semiconductor die 502c of the flip-chip BGA semiconductor package 550c may be designed to be separated from a thermoelectric device chip 504b packaged within.

In this embodiment as shown in FIG. 4, the flip-chip BGA semiconductor package 550c is a package of large power consumption with a function similar to the flip-chip BGA semiconductor package 550b. The semiconductor die 502c of the flip-chip BGA semiconductor package 550c has a top surface 507 and a bottom surface 505. The top surface 507 of the semiconductor die 502c is coupled to the pad 226 of the substrate 200 using solder balls 530 disposed thereon. The bottom surface 505 of the semiconductor die 502c is coupled to the thermoelectric device chip 504b using pads 528 disposed on. In this embodiment, the pads 528 of the semiconductor die 502c is separated from corresponding pads 526 of the thermoelectric device chip 504c by conductive bumps 530. As shown in FIG. 4, the pads 528 of the semiconductor die 502c and the pads 526 of the thermoelectric device chip 504c are in contact with the corresponding conductive bumps 530.

Figure 5:
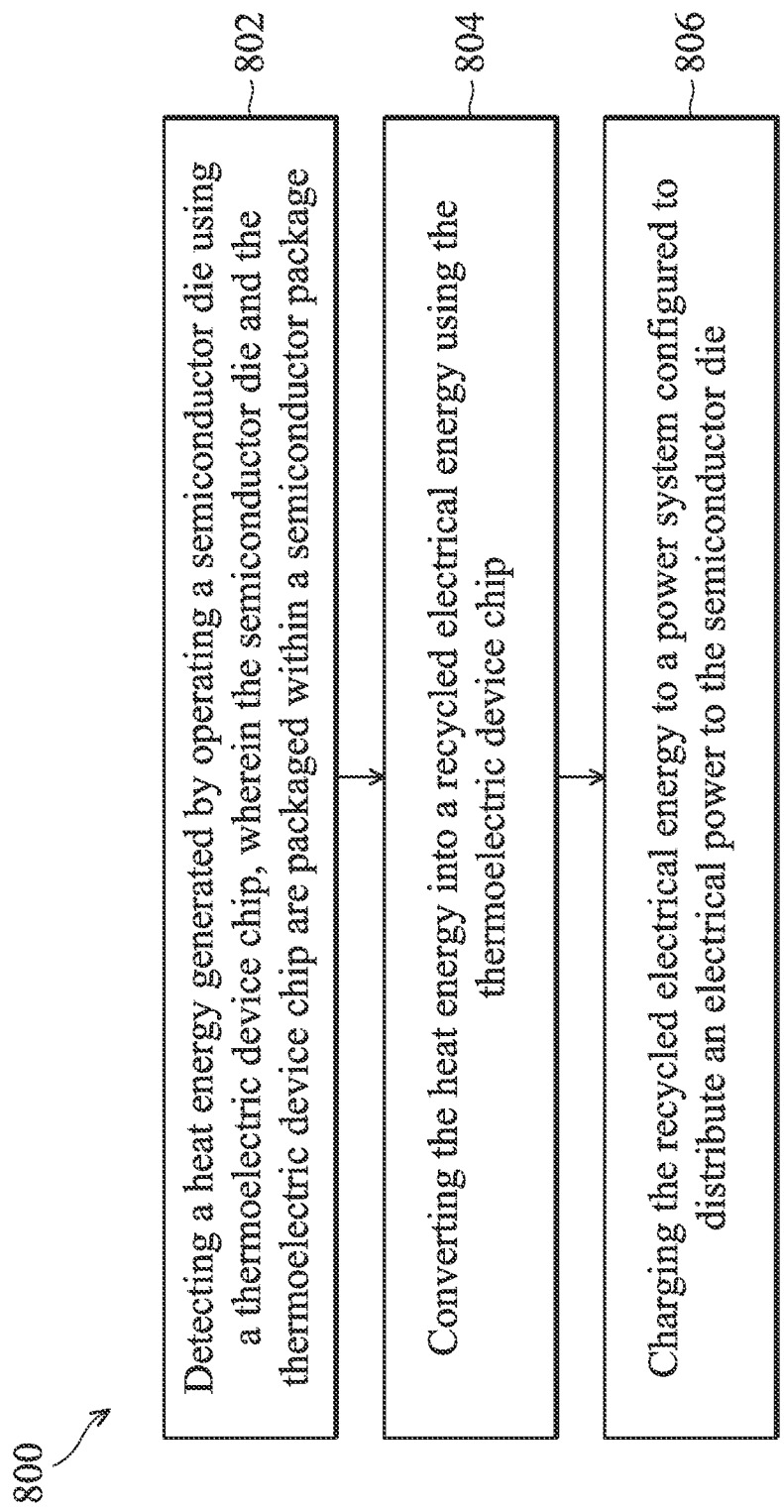
FIG. 5 is a flow chart showing a method for converting a thermal energy into an electrical energy in a portable electronic system as shown in FIG. 1.

FIG. 5 is a flow chart showing a method 800 for converting a thermal energy into an electrical energy in a portable electronic system as shown in FIG. 1. Please refer to FIGS. 1 and 5, in step 802, the thermoelectric device chip 504 is used to detect a heat energy $H_T$ generated by operating a semiconductor die 502. It should be noted that the semiconductor die 502 and the thermoelectric device chip 504 are packaged within a semiconductor package, for example, the wire-bond BGA semiconductor package 550a and the flip-chip BGA semiconductor packages 550b-550c as shown in FIGS. 2-4. Please refer to FIGS. 2-4, each of the thermoelectric device chips 504a-504c has the bottom surface 510 close to the semiconductor die 502b-502c and the top surface 512 opposite to the bottom surface 510. Each of the thermoelectric device chips 504a-504c is arranged in such a way that the top surface 512 is exposed to air, and the bottom surface 510 is covered by the molding compound 522. The temperature of the bottom surface 510 is higher than that of the top surface 512 while operating the semiconductor dies 500a-500c (step 802).

Next, in step 804, the heat energy $H_T$ is converted into a recycled electrical energy using the thermoelectric device chip 504 and then output as the current $I_2$ as shown in FIG. 1. Next, in step 806, the recycled electrical energy (as the current $I_2$) is charged to a power system 600 as shown in FIG. 1. It should be noted that the power system 600 is configured to distribute an electrical power to the semiconductor die 500 as shown in FIG. 1. In some embodiments, the step 806 further includes transmitting the recycled electrical energy to a charger of the power system 600 as shown in FIG. 1, so that the charger stored the recycled electrical energy as a stored recycled electrical energy. In some embodiments, the step 806 further includes translating the stored recycled electrical energy into the current $I_2$ to charge the battery 700 after transmitting the recycled electrical energy to a charger of the power system 600 as shown in FIG. 1.

Embodiments provide a portable electronic system with the thermal recycling function. The portable electronic system includes a thermal energy recycling semiconductor package having at least one semiconductor die with large power consumption and a thermoelectric device chip disposed close thereto. The portable electronic system allows the heat energy generated from the semiconductor die of the thermal energy recycling semiconductor package to be converted into a recycled electrical energy to be stored in the power system and charge the battery. Accordingly, the heat energy generated from the semiconductor die can be recycled to an electrical energy to provide to the portable electronic system.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A portable electronic system, comprising:
    a base;
    a semiconductor package mounted on the base, comprising:
        a substrate;
        a semiconductor die coupled to the substrate; and
        a thermoelectric device chip disposed over the semiconductor die, coupled to the substrate, configured to detect a heat energy generated from the semiconductor die and to convert the heat energy into a recycled electrical energy;

a shielding case disposed on the base, surrounding the semiconductor package, and the thermoelectric device chip exposed by an opening of the shielding case; and a power system coupled to the semiconductor package, configured to store the recycled electrical energy.

2. The portable electronic system as claimed in claim 1, further comprising a battery coupled to the power system, configured to supply an electrical energy to the power system, and to be charged with a stored recycled electrical energy from the power system.

3. The portable electronic system as claimed in claim 1, wherein an inner sidewall of the shielding case is spaced apart from a sidewall of semiconductor package by a distance.

4. The portable electronic system as claimed in claim 3, wherein a space surrounded by the sidewall of the semiconductor package, the shielding case and the base is filled with air.

5. The portable electronic system as claimed in claim 3, further comprising an insulation film disposed on the inner sidewall of the shielding case.

6. The portable electronic system as claimed in claim 1, wherein the semiconductor die has a top surface and a bottom surface, the semiconductor die is coupled to the substrate using solder balls disposed on the top surface, and the semiconductor die is coupled to the thermoelectric device chip using pads disposed on the bottom surface.

7. The portable electronic system as claimed in claim 6, wherein the pads of the semiconductor die are in contact with corresponding pads of the thermoelectric device chip.

8. The portable electronic system as claimed in claim 7, wherein the semiconductor package comprises conductive bumps, wherein the conductive bumps are connected to the pads of the semiconductor die and the corresponding pads of the thermoelectric device chip.

9. A semiconductor package assembly, comprising:
a base;
a semiconductor package, comprising:
a substrate mounted on the base;
a semiconductor die coupled to the substrate; and
a thermoelectric device chip laminating on the semiconductor die, wherein the thermoelectric device chip is configured to detect a heat energy generated from the semiconductor die and to convert the heat energy into a recycled electrical energy;
a shielding case disposed on the base, wherein the shielding case surrounds the semiconductor package without covering a top surface of the thermoelectric device chip; and
a power system mounted on the base and coupled to the thermoelectric device chip, configured to store the recycled electrical energy.

10. The semiconductor package assembly as claimed in claim 9, further comprising a molding compound covers the substrate and surrounds the semiconductor die and thermoelectric device chip, leaving the top surface of the thermoelectric device chip, a sidewall and a bottom surface of the substrate exposed.

11. The semiconductor package assembly as claimed in claim 10, wherein a space surrounded by the sidewalls of the molding compound and the substrate, the shielding case and the base is filled with air.

12. The semiconductor package assembly as claimed in claim 10, further comprising an insulation film disposed on an inner sidewall of the shielding case.

13. The semiconductor package assembly as claimed in claim 9, wherein the semiconductor die is coupled to the substrate using bonding wires, and is separated from the thermoelectric device chip.

14. The semiconductor package assembly as claimed in claim 9, wherein the semiconductor die has a top surface and a bottom surface, the semiconductor die is coupled to the substrate using solder balls disposed on the top surface, and the semiconductor die is coupled to the thermoelectric device chip using pads disposed on the bottom surface.

15. The semiconductor package assembly as claimed in claim 14, wherein the pads of the semiconductor die are in contact with corresponding pads of the thermoelectric device chip.

16. A method for converting a thermal energy into an electrical energy in a portable electronic system, comprising:
detecting a heat energy generated by operating a semiconductor die using a thermoelectric device chip, wherein the semiconductor die and the thermoelectric device chip are packaged within a semiconductor package that is mounted on a base, wherein a shielding case is disposed on the base, surrounds the semiconductor package, and the thermoelectric device chip is exposed by an opening of the shielding case;
converting the heat energy into a recycled electrical energy using the thermoelectric device chip; and
charging the recycled electrical energy to a power system configured to distribute an electrical power to the semiconductor die.

17. The method as claimed in claim 16, wherein charging the recycled electrical energy to the power system further comprises:
transmitting the recycled electrical energy to a charger of the power system, so that the charger stored the recycled electrical energy as a stored recycled electrical energy.

18. The method as claimed in claim 16, wherein the thermoelectric device chip has a first surface facing close to the semiconductor die and a second surface opposite to the first surface, wherein a temperature of the first surface is higher than that of the second surface during operation of the semiconductor die.

* * * * *